United States Patent
Beach

(10) Patent No.: US 7,759,699 B2
(45) Date of Patent: Jul. 20, 2010

(54) III-NITRIDE ENHANCEMENT MODE DEVICES

(75) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 77 days.

(21) Appl. No.: 11/481,771

(22) Filed: Jul. 6, 2006

(65) Prior Publication Data

US 2007/0007547 A1    Jan. 11, 2007

Related U.S. Application Data

(60) Provisional application No. 60/696,985, filed on Jul. 6, 2005.

(51) Int. Cl.
*H01L 29/80*    (2006.01)

(52) U.S. Cl. .......... 257/192; 257/190; 257/E29.246; 257/E29.247; 257/E29.248; 257/E29.249; 257/E29.252; 257/E21.403; 257/E21.407

(58) Field of Classification Search .......... 257/E29.246, 257/E29.252, E21.403, E21.407, 190, 192, 257/E29.247, E29.248, E29.249
See application file for complete search history.

(56) References Cited

U.S. PATENT DOCUMENTS

| | | | |
|---|---|---|---|
| 5,682,041 A | 10/1997 | Kawakubo et al. | |
| 6,040,225 A | 3/2000 | Boles | |
| 6,140,169 A | 10/2000 | Kawai | |
| 6,531,718 B2 * | 3/2003 | Inoue et al. | 257/189 |
| 6,753,593 B1 | 6/2004 | Jefferson et al. | |
| 2002/0017696 A1 * | 2/2002 | Nakayama et al. | 257/471 |
| 2003/0020092 A1 | 1/2003 | Parikh et al. | |
| 2003/0089906 A1 | 5/2003 | Ueda | |
| 2004/0211976 A1 * | 10/2004 | Twynam | 257/192 |
| 2004/0221508 A1 | 11/2004 | Jin et al. | |
| 2004/0241975 A1 * | 12/2004 | Faure et al. | 438/607 |
| 2005/0020031 A1 * | 1/2005 | Letertre et al. | 438/455 |
| 2005/0124100 A1 | 6/2005 | Robinson | |
| 2005/0142810 A1 | 6/2005 | Bridger | |
| 2005/0189559 A1 * | 9/2005 | Saito et al. | 257/189 |
| 2006/0273347 A1 * | 12/2006 | Hikita et al. | 257/192 |

FOREIGN PATENT DOCUMENTS

WO  PCT/US2002/023056    7/2002
WO  WO 2004/053210    6/2004

OTHER PUBLICATIONS

International Search Report issued in corresponding PCT Application No. PCT/US06/26323 dated Feb. 5, 2008.

* cited by examiner

*Primary Examiner*—Kenneth A Parker
*Assistant Examiner*—Jay C Kim
(74) *Attorney, Agent, or Firm*—Farjami & Farjami LLP

(57) ABSTRACT

A III-nitride power semiconductor device that includes a nitrogen polar active heterojunction having a two-dimensional electron gas and including a first III-nitride semiconductor body by one band gap and a second III-nitride body having another band gap over the first III-nitride semiconductor body, a gate arrangement, a gate barrier under the gate arrangement thereof, a first power electrode and a second power electrode, and a method for fabricating the device.

13 Claims, 5 Drawing Sheets

Under Ohmic

Under Gate

III-NITRIDE ENHANCEMENT MODE DEVICES

RELATED APPLICATION

This application is based on and claims the benefit of U.S. Provisional Application Ser. No. 60/696,985, filed on Jul. 6, 2005, entitled ACHIEVE ENHANCEMENT MODE DEVICES IN GaN, to which a claim of priority is hereby made and the disclosure of which is incorporated by reference.

FIELD OF THE INVENTION

The present invention relates to power semiconductor devices and more particularly to III-nitride power semiconductor devices.

BACKGROUND OF THE INVENTION

A high electron mobility transistor (HEMT) is an example of a conventional power semiconductor device. A HEMT may be fabricated using a III-nitride semiconductor, which, when referred to herein, means a semiconductor alloy from the AlInGaN system such as GaN, AlGaN, InGaN, or the like.

A HEMT according to the conventionally known art includes a first III-nitride semiconductor body, which may be composed of, for example, undoped GaN, and a second III-Nitride semiconductor body, which may be composed of, for example, AlGaN, disposed over first III-nitride semiconductor body. As is well known, the heterojunction of first III-nitride semiconductor body and second III-nitride semiconductor body results in the formation of a conductive region usually referred to as a two dimensional electron gas (2DEG).

A typical HEMT further includes at least two power electrodes. The current is conducted through the 2DEG between the two power electrodes.

A HEMT may also include a gate arrangement which can be operated to disable and enable the 2DEG as desired, thereby turning the device ON or OFF. As a result, a HEMT can be operated like a field effect transistor. Indeed, such a device is sometimes referred to as a heterojunction field effect transistor (HFET).

Due to their low loss, high current carrying and high breakdown voltage capabilities III-nitride-based heterojunction power semiconductor devices are suitable for power applications. However, many III-nitride semiconductor devices are normally ON, which means that a bias to the gate is required to render the device OFF. Normally ON devices are less desirable for power application because: a) such devices are operated less efficiently that normally ON devices; b) the drive circuitry for normally ON device are more complicated and thus more expensive.

It is thus desirable to have a normally OFF III-nitride power semiconductor device.

SUMMARY OF THE INVENTION

It is an object of the present invention to provide a normally off III-nitride power semiconductor device and a method for the fabrication thereof.

According to an aspect of the present invention, nitrogen polar III-nitride semiconductor (e.g. nitrogen polar GaN) is used to fabricate a semiconductor device.

A power semiconductor device according to the preferred embodiment of the present invention includes preferably a substrate, a nitrogen polar active heterojunction having a two dimensional electron gas that includes a first III-nitride semiconductor body having one band gap, and a second III-nitride semiconductor body having another band gap over said first III-nitride semiconductor body, a gate arrangement coupled to at least said second III-nitride semiconductor body, a gate barrier interposed between said gate arrangement and said second III-nitride semiconductor body to interrupt said two dimensional electron gas when said gate is not biased, and a first power electrode and a second power electrode coupled to said at least second III-nitride semiconductor body.

In the preferred embodiment of the present invention, the gate barrier is composed of an alloy from the AlInGaN system. For example, the gate barrier may be composed of AlGaN.

In an embodiment of the present invention, the gate barrier may be spaced from each power electrode by an insulation spacer. The insulation spacers may be an oxide. For example, the insulation spacers may be composed of $(AlGa)_2O_3$.

In another embodiment of the present invention, the semiconductor device may include multiple active III-nitride heterojunctions, each including a 2DEG. At least one of the active heterojunctions can include a recess in which the gate arrangement is received.

A device according to the present invention is preferably fabricated by growing a III-nitride semiconductor body, which is preferably GaN, implanting hydrogen ions into a region in said III-nitride semiconductor body, separating said semiconductor body along said region to obtain an nitrogen polar III-nitride semiconductor body, and fabricating a III-nitride semiconductor device over said nitrogen polar semiconductor body.

According to an aspect of the present invention, the method allows for obtaining a nitrogen polar III-nitride body, e.g. nitrogen polar GaN, which in turn allows for the fabrication of enhancement type (normally OFF) devices.

The method may further include bonding a substrate to said III-nitride semiconductor body.

Other features and advantages of the present invention will become apparent from the following description of the invention which refers to the accompanying drawings.

DETAILED DESCRIPTION OF THE EMBODIMENTS

Figure 1:
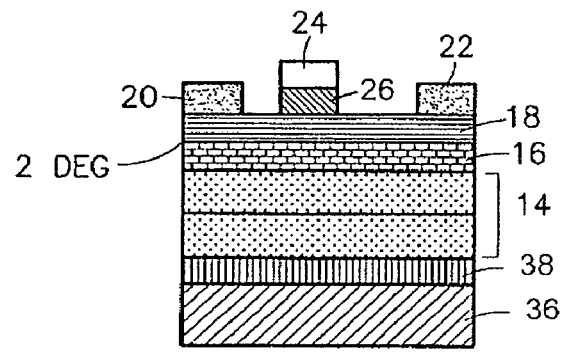
FIG. 1 schematically shows a cross-sectional view of a device according to the first embodiment of the present invention.

Referring to FIG. 1, a semiconductor device according to the first embodiment of the present invention includes substrate 10, bonding layer 12, first III-nitride buffer body 14, first III-nitride semiconductor body 16, second III-nitride semiconductor body 18, first power electrode 20 and a second power electrode 22 electrically coupled to second III-nitride semiconductor body 18, and a gate arrangement 24.

According to an aspect of the present invention a gate barrier 26 is disposed under gate arrangement 24 and over second III-nitride semiconductor body 18. Gate barrier 26 is an alloy from the AlInGaN, and may be preferably AlGaN According to another aspect of the present invention, buffer layer 14 is a nitrogen polar III-nitride semiconductor material, for example, nitrogen polar GaN. As a result the entire stack formed on buffer layer 14 is nitrogen polar. First III-nitride semiconductor 16 and second III-nitride semiconductor 18 are different alloys from the AlInGaN system each having a band gap different from the other. Preferably, first III-nitride semiconductor body 16 is AlGaN, while second III-nitride semiconductor body 18 is GaN. Note that 2DEG is formed at the heterojunction of first III-nitride semiconductor body 16 and second III-nitride semiconductor body 18, as is well known. Power electrodes 20, 22 are thus electrically coupled to the 2DEG for current conduction. The device illustrated by FIG. 1 is a normally OFF device. That is, due to the presence of gate barrier 26, the 2DEG is interrupted. Note that gate arrangement 24 includes a gate electrode (not specifically illustrated) which, when biased, restores the 2DEG to allow for conduction. Thus, when no bias is applied to the gate electrode the device remains off. Gate electrode may be coupled to the heterojunction of first III-nitride semiconductor 16, and second III-nitride semiconductor 18 through a schottky contact with gate barrier 26, or may be coupled through a gate insulator, e.g. Si3N4, SiO2 or the like without deviating from the scope and the spirit of the present invention.

According to an aspect of the present invention smart cut technology is used to fabricate a device according to the present invention.

Figure 2A:
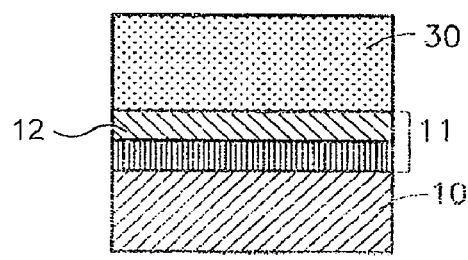
FIGS. 2A-2F schematically show a method of fabricating a device according to the present invention.

A power semiconductor device according to the present invention is fabricated by first growing a transition layer 11 (e.g., AlN) on a suitable substrate 10 (e.g., Si), and then growing a buffer material 30 on transition layer 12, as illustrated by FIG. 2A.

Substrate 10 is preferably silicon, but may be a SiC, sapphire, or a GaN substrate without deviating from the scope and spirit of the present invention.

Figure 2B:
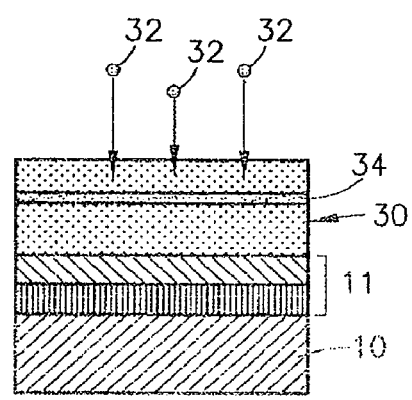

Transition layer 11 may be preferably composed of one AlN, which is graded to have different aluminum concentration along the thickness thereof, or a stack of AlN layers of varying aluminum content as is well known. Buffer material 30 is preferably GaN As illustrated by FIG. 2B, after the buffer material 30 is grown, hydrogen atoms 32 are implanted therein at a desired depth to form an implant region 34. The hydrogen atom act to break the bonds between Galium and Nitrogen so that it can be easily separated.

Figure 2C:
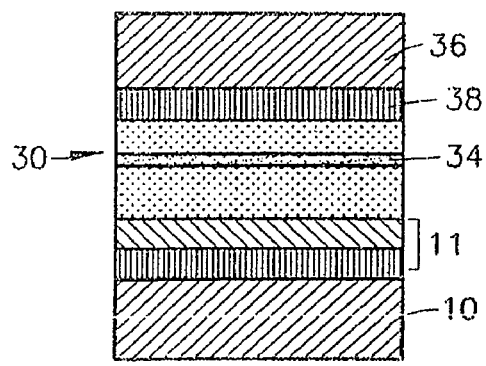
Figure 2D:
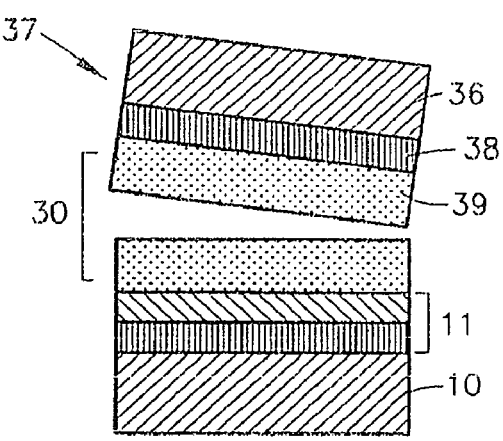

Referring next to FIG. 2C, a silicon material is bonded to the top surface of GaN layer 30 through, for example, silicon dioxide bonding layer 38. GaN layer 30 is split along implant site 34, and the top layer thereof is removed by removing silicon wafer 36. Specifically, an annealing strip is applied which causes GaN layer 30 to split, the top portion thereof to be removed as silicon wafer 36 is removed. Note that top portion 37 includes a nitrogen polar GaN body 39

Figure 2E:
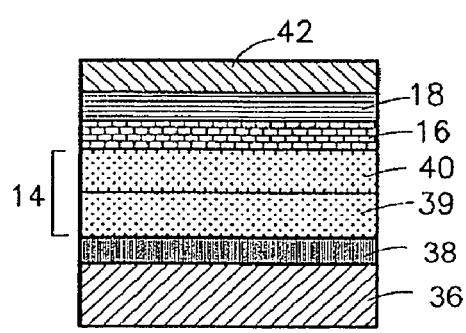
Figure 2F:
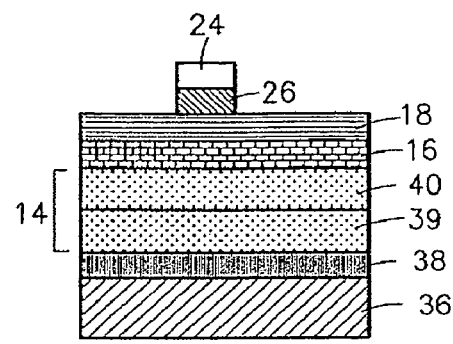

Next, top portion 37 is flipped, and another layer of GaN 40 is grown on nitrogen polar GaN 39 using, for example, molecular beam epitaxy (MBE), whereby buffer layer 14 is formed. Thereafter, first III-nitride semiconductor body 16 (e.g. AlGaN) is grown on buffer layer 14, second III-nitride semiconductor body 18 (e.g. GaN) is grown on first III-nitride semiconductor body 16, and gate barrier material 42 is formed on second III-nitride semiconductor body 18, as illustrated in FIG. 2E. Materials for the gate arrangement are then deposited on gate barrier material 42 and the stack is patterned and etched to obtain gate arrangement 24 over gate barrier 26, as illustrated in FIG. 2F. Power electrodes 20, 22 are then formed to obtain a device according to the first embodiment as illustrated in FIG. 1. Note that the method as described results in a self-aligned gate arrangement.

Also note that although smart cutting is a preferred method, other method can be used to obtain nitrogen polar GaN. For example, a substrate can be selected on which nitrogen polar buffer GaN is grown prior to the fabrication of the devices.

Figure 3A:
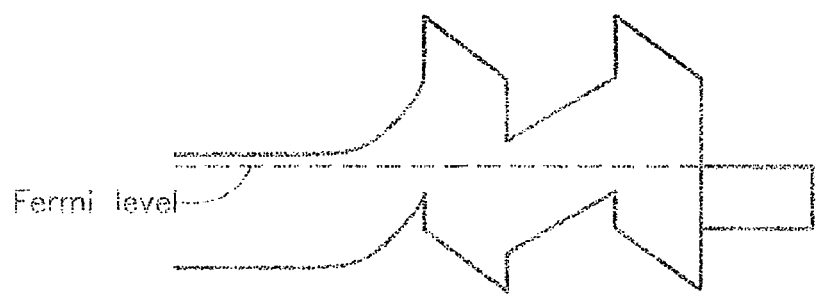
FIG. 3A shows a band diagram resulting from the addition of a gate barrier according to the present invention.
Figure 3B:
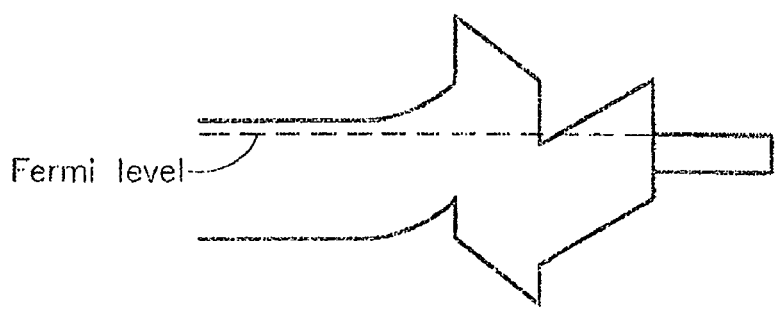
FIG. 3B shows a band diagram illustrating the results obtained from the addition of a gate barrier under the gate arrangement.

Referring to FIG. 3A, under the gate, gate barrier 26 (e.g. AlGaN) causes the bands to rise away from the structure. This added potential pulls the conduction band above the fermi level, turning off the device. However, after the removal of the gate barrier layer, the conduction band will lie below the fermi level resulting in accumulation and a high mobility 2DEG, as illustrated by FIG. 3B. Thus, leaving a portion of the gate barrier material under the gate arrangement as described results in the interruption of the 2DEG, which can be then restored upon application of an appropriate bias. As a result, an enhancement mode III-nitride device can be obtained according to the concept described herein.

A device according to the first embodiment is advantageous because:

it is an enhancement mode device;

it includes self-aligned gates;

its insulating back plane eliminates vertical breakdown voltage issues;

it does not require a thick epitaxial layer of GaN on a Si substrate;

its thin GaN buffer reduces parasitic leakage through the buffer under gate.

Figure 4:
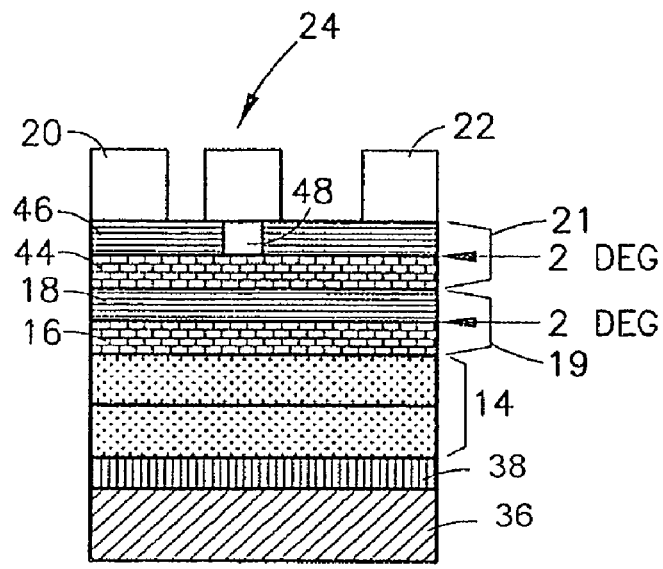
FIG. 4 schematically illustrates a cross-sectional view of a device according to the second embodiment of the present invention.

Referring next to FIG. 4, a power semiconductor device according to the second embodiment includes third III-nitride semiconductor body 44, which may be the same material as first III-nitride semiconductor body 16 (e.g., AlGaN), and fourth III-nitride semiconductor body 46, which may be the same material as second III-nitride semiconductor body 18 (e.g., GaN). Note that fourth III-nitride semiconductor body 46 includes recess 48 to interrupt the 2DEG at the heterojunction of third 44 and fourth 46 III-nitride semiconductor bodies. Gate arrangement 24 is received in recess 48. Although FIG. 4 shows two active III-nitride heterojunctions 19, 21, each including a 2DEG, a device according to the second embodiment can include multiple active III-nitride heterojunctions for increased conduction. Further note that in this embodiment layer 44 acts as a gate barrier as well as being part of an active heterojunction.

Figure 5A:
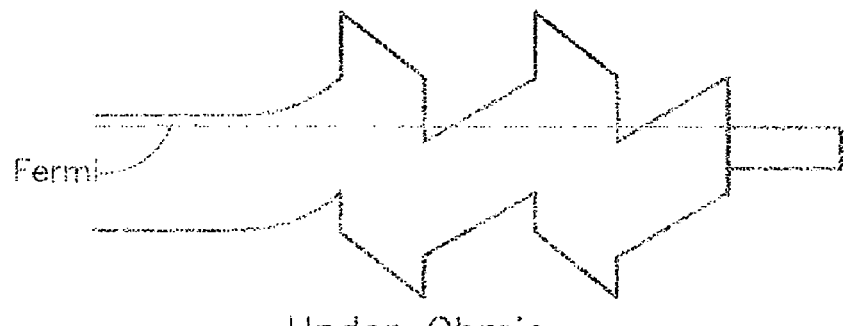
FIG. 5A shows the band diagram under the power electrodes of the second embodiment.
Figure 5B:
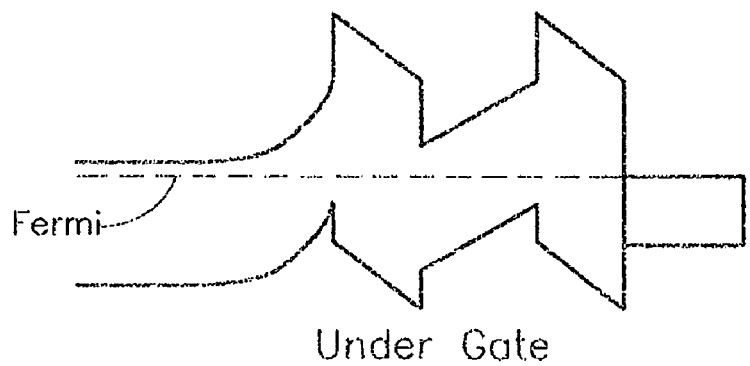
FIG. 5B shows the band diagram under the gate arrangement of the second embodiment.

Note that FIG. 5A graphically illustrates the band diagram relating to the condition of the bands under power electrodes 20, 22, while FIG. 5B graphically illustrates a band diagram to illustrate the condition under gate arrangement 24 of a device according to the second embodiment.

A device according to the second embodiment is fabricated according to the steps illustrated in FIGS. 2A-2F, except that third 44 and fourth 46 III-nitride semiconductor bodies are formed, and fourth III-nitride semiconductor body is recessed prior to forming the gate arrangement and power electrodes 20, 22.

A device according to the second embodiment is advantageous because:

it is an enhancement mode device;

it includes self-aligned gates;

its insulating back plane eliminates vertical breakdown voltage issues;

it does not require a thick epitaxial layer of GaN on a Si substrate;

its thin GaN buffer reduces parasitic leakage through the buffer under gate;

it can be fabricated using well known techniques because selective etch for GaN over AlGaN is known;

the fabrication thereof may allow for possible oxidation of AlGaN.

Figure 6:
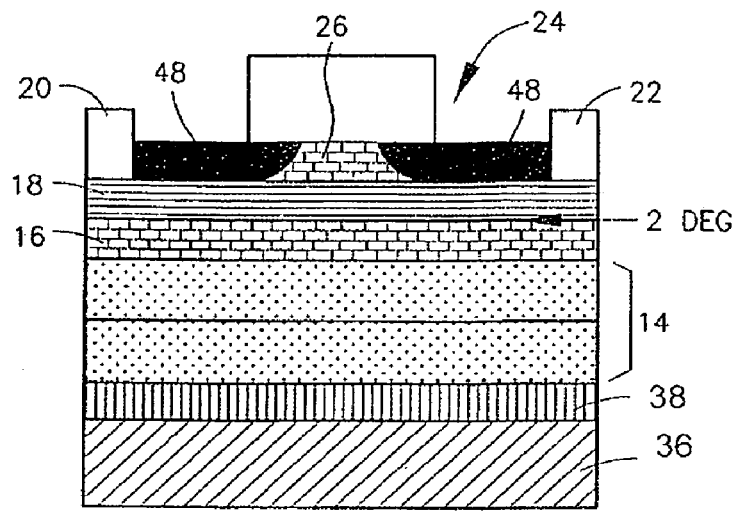
FIG. 6 schematically illustrates a cross-sectional view of a device according to the third embodiment of the present invention.

Referring next to FIG. 6, a device according to the third embodiment includes gate barrier 26 on second III-nitride semiconductor 18 and under gate arrangement 24, which is spaced from a respective power electrode on either side thereof by an oxide body 48, for example, $(AlGa)_2O_3$.

Figure 7A:
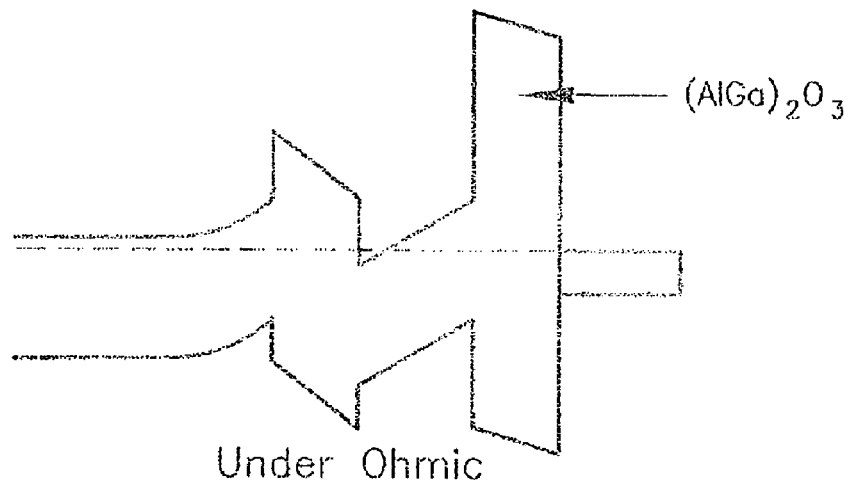
FIG. 7A shows the band diagram under the power electrodes of the third embodiment.
Figure 7B:
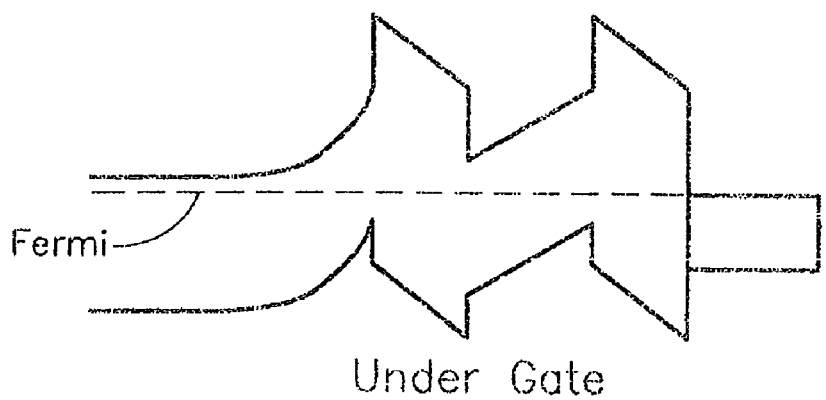
FIG. 7B shows the band diagram under the gate arrangement of the third embodiment.

FIG. 7A illustrates the band diagram relating to the conditions under the power electrodes in the third embodiment, while FIG. 7B illustrates a band diagram relating to the conditions under gate arrangement 24.

Note that a device according to the third embodiment is fabricated according to the same steps illustrated by FIGS. 2A-2B, except that a barrier material 42 is appropriately oxidized before gate arrangement is fabricated.

Figure 8:
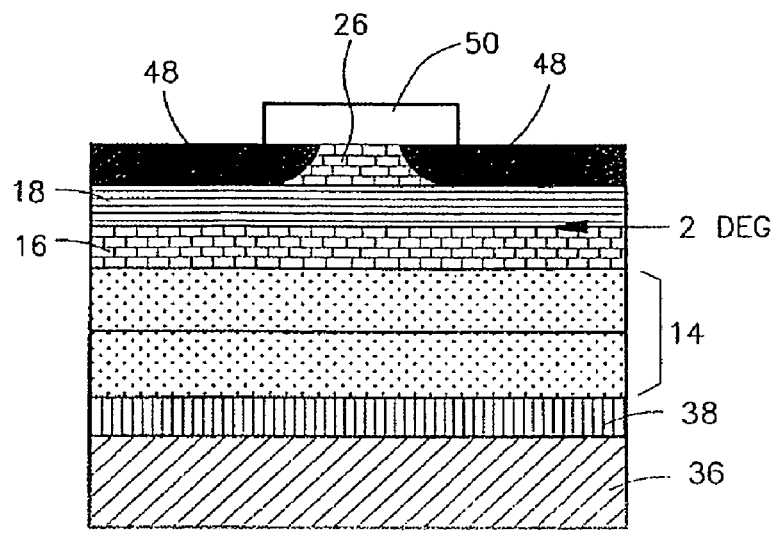
FIG. 8 schematically illustrates a step in the fabrication of the third embodiment.
Figure 9:
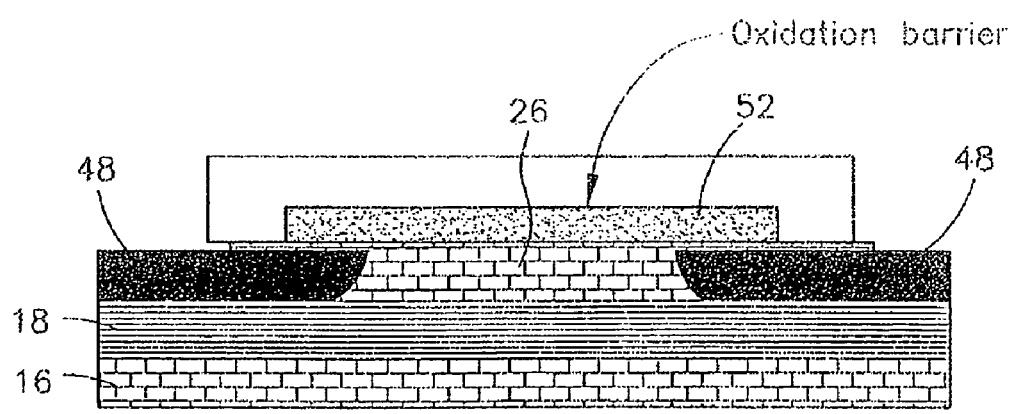
FIG. 9 schematically illustrates a variation of the third embodiment.

Oxide bodies 48 can be formed by masking a portion that is not to be oxidized with an appropriate mask, and then oxidizing the unmasked portions. Thus, as illustrated by FIG. 8, a mask 50 is applied and the unmasked portions are oxidized. A suitable mask material can be $Si_3N_4$. Another suitable mask can be formed with silicon, which after oxidation, turns into $SiO_2$ 52. $SiO_2$ 52 can then be used as a gate insulator.

The following advantages are apparent from the disclosed subject matter:

nitrogen polar material opens additional pathways for achieving enhancement mode III-nitride devices;

multiple heterojunctions can be used to produce or prevent 2DEG depending on the number of layers;

the use of smart cut technology allows for the production of GaN material on Si substrates without requiring a thick epitaxial GaN on silicon;

wafer bonding eliminates the vertical break down voltage;

wafer bonding reduces GaN buffer thickness and the corresponding leakage path, and also reduces constraints on buffer resistivity, thus eliminating the need for C or Fe coping and corresponding trapping issues;

nitrogen polar material reduces the complexity of smart cut by eliminating the second flip in bonding flow.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:

a substrate;

a nitrogen polar active heterojunction having a two dimensional electron gas that includes a first III-nitride semiconductor body having one band gap, and a second III-nitride semiconductor body having another band gap over said first III-nitride semiconductor body;

a gate arrangement coupled to at least said second III-nitride semiconductor body;

a gate barrier interposed between said gate arrangement and said second III-nitride semiconductor body to provide an added potential to pull a conduction band above a Fermi level thereof to interrupt said two dimensional electron gas when said gate arrangement is not biased; and a first power electrode and a second power electrode coupled to at least said second III-nitride semiconductor body;

wherein said another band gap of said second III-nitride semiconductor body is smaller than said one band gap of said first III-nitride semiconductor body.

2. The power semiconductor device of claim 1, further comprising a III-nitride buffer layer and a bonding layer between said III-nitride buffer layer and said substrate.

3. The power semiconductor device of claim 2, wherein said substrate is comprised of silicon and said bonding layer is comprised of silicon dioxide.

4. The power semiconductor device of claim 3, wherein said III-nitride buffer layer is comprised of GaN.

5. The power semiconductor device of claim 1, wherein said gate barrier is comprised of an alloy of InAlGaN.

6. The power semiconductor device of claim 1, wherein said gate barrier is comprised of AlGaN.

7. A power semiconductor device comprising:

a substrate;

a nitrogen polar buffer layer over said substrate;

a first III-nitride semiconductor body over said nitrogen polar buffer layer and a second III-nitride semiconductor body over said first III-nitride semiconductor body;

a two dimensional electron gas formed at a heterojunction of said first III-nitride semiconductor body and said second III-nitride semiconductor body;

a gate arrangement coupled to said second III-nitride semiconductor body;

a gate barrier interposed between said gate arrangement and said second III-nitride semiconductor body to provide an added potential to pull a conduction band above a Fermi level thereof to interrupt said two dimensional electron gas when said gate arrangement is not biased; and a first power electrode and a second power electrode coupled to said second III-nitride semiconductor body;

wherein said first III-nitride semiconductor body has one band gap and said second III-nitride semiconductor body has another band gap, said another band gap being smaller than said one band gap.

8. The power semiconductor device of claim 7, further comprising a bonding layer between said substrate and said nitrogen polar buffer layer.

9. The power semiconductor device of claim 7, wherein said heterojunction is a nitrogen polar active heterojunction.

10. The power semiconductor device of claim 7, wherein said nitrogen polar buffer layer comprises GaN.

11. The power semiconductor device of claim 7, wherein said gate barrier comprises an alloy of InAlGaN.

12. The power semiconductor device of claim 7, wherein said gate barrier comprises AlGaN.

13. The power semiconductor device of claim 8, wherein said bonding layer comprises silicon dioxide.

* * * * *